United States Patent
Feiweier

(10) Patent No.: US 10,345,410 B2
(45) Date of Patent: Jul. 9, 2019

(54) MAGNETIC RESONANCE APPARATUS AND METHOD FOR THE ACQUISITION OF SCAN DATA OF AN EXAMINATION OBJECT

(71) Applicant: Siemens Healthcare GmbH, Erlangen (DE)

(72) Inventor: Thorsten Feiweier, Poxdorf (DE)

(73) Assignee: Siemens Healthcare GmbH, Erlangen (DE)

( * ) Notice: Subject to any disclaimer, the term of this patent is extended or adjusted under 35 U.S.C. 154(b) by 202 days.

(21) Appl. No.: 15/281,697

(22) Filed: Sep. 30, 2016

(65) Prior Publication Data

US 2017/0089994 A1    Mar. 30, 2017

(30) Foreign Application Priority Data

Sep. 30, 2015    (DE) .................. 10 2015 218 850

(51) Int. Cl.
*G01V 3/00* (2006.01)
*G01R 33/483* (2006.01)
(Continued)

(52) U.S. Cl.
CPC ....... *G01R 33/4838* (2013.01); *G01R 33/565* (2013.01); *G01R 33/5607* (2013.01);
(Continued)

(58) Field of Classification Search
CPC .................................................. G01R 33/4838
(Continued)

(56) References Cited

U.S. PATENT DOCUMENTS 9,651,644 B2 *   5/2017   Feiweier .............. G01R 33/563
9,689,943 B2 *   6/2017   Neji ..................... G01R 33/483
(Continued)

OTHER PUBLICATIONS

Ozhinsky et al., "Improved Spatial Coverage for Brain 3D Press MRSI by Automatic Placement of Outer-Volume Suppression Saturation Bands," Journal of Magnetic Resonance Imaging, vol. 33, pp. 792-802 (2011).
(Continued)

*Primary Examiner* — Louis M Arana
(74) *Attorney, Agent, or Firm* — Schiff Hardin LLP

(57) ABSTRACT

The method and apparatus for the acquisition of scan data of an examination object by execution of a magnetic resonance scanning protocol having at least one suppression module, a relevant volume in the examination object is determined in which the magnetization of the examination object to be examined is to be manipulated and/or the scan data are to be acquired. For each suppression module contained in the scanning protocol, the associated suppression volume in which signals are to be suppressed is determined. The relevant volume that has been determined is optimized by taking account of the determined suppression volumes. Optimized scanning parameters of the scanning protocol are determined such that the best possible scanning conditions prevail in the optimized relevant volume. The scanning protocol is executed as a scanner with the optimized scanning parameters determined and the scan data acquired thereby are made available as a data file.

9 Claims, 4 Drawing Sheets

(51) Int. Cl.
*G01R 33/56* (2006.01)
*G01R 33/563* (2006.01)
*G01R 33/565* (2006.01)

(52) U.S. Cl.
CPC ... *G01R 33/5608* (2013.01); *G01R 33/56308* (2013.01); *G01R 33/56341* (2013.01)

(58) Field of Classification Search
USPC .......................................... 324/307, 309, 306
See application file for complete search history.

(56) References Cited

U.S. PATENT DOCUMENTS

| | | | |
|---|---|---|---|
| 2010/0219829 A1* | 9/2010 | Rehwald | G01R 33/4818 324/309 |
| 2010/0286802 A1 | 11/2010 | Feiweier et al. | |
| 2011/0172515 A1 | 7/2011 | Fautz et al. | |
| 2012/0197104 A1* | 8/2012 | Posse | G01R 33/4833 600/410 |
| 2016/0091586 A1 | 3/2016 | Benner et al. | |
| 2016/0291111 A1* | 10/2016 | Pfeuffer | G01R 33/5607 |

OTHER PUBLICATIONS

Ozhinsky et al., "Automated Prescription of Oblique Brain 3D Magnetic Resonance Spectroscopic Imaging," Magnetic Resonance in Medicine, vol. 69, pp. 920-930 (2013).

* cited by examiner

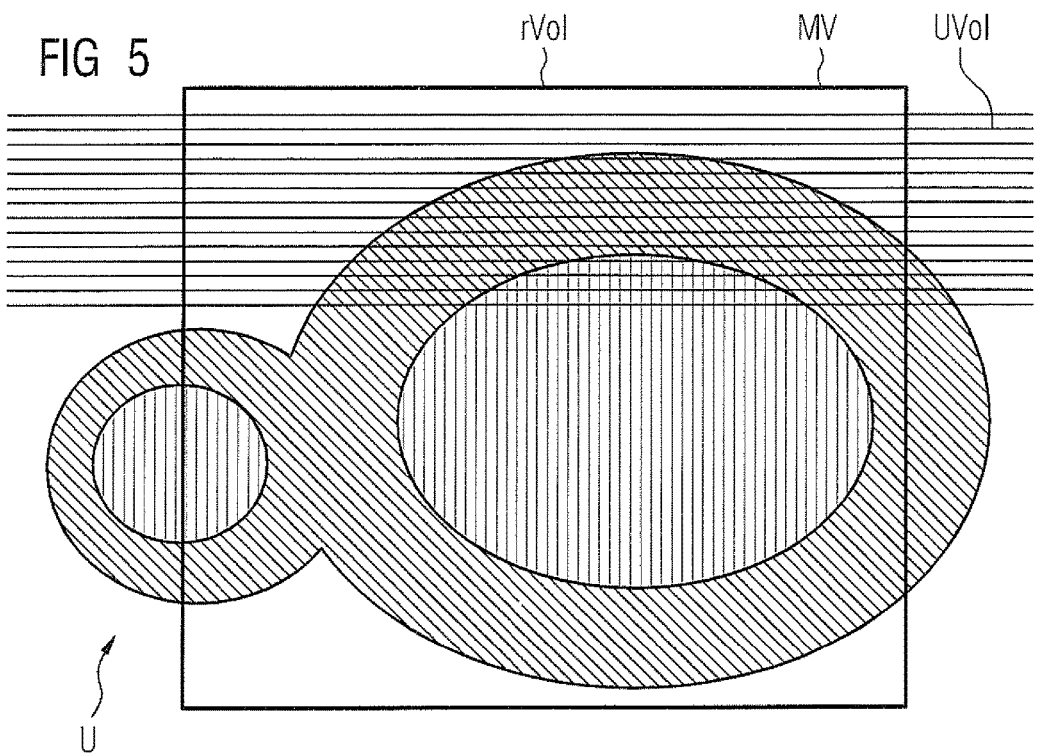
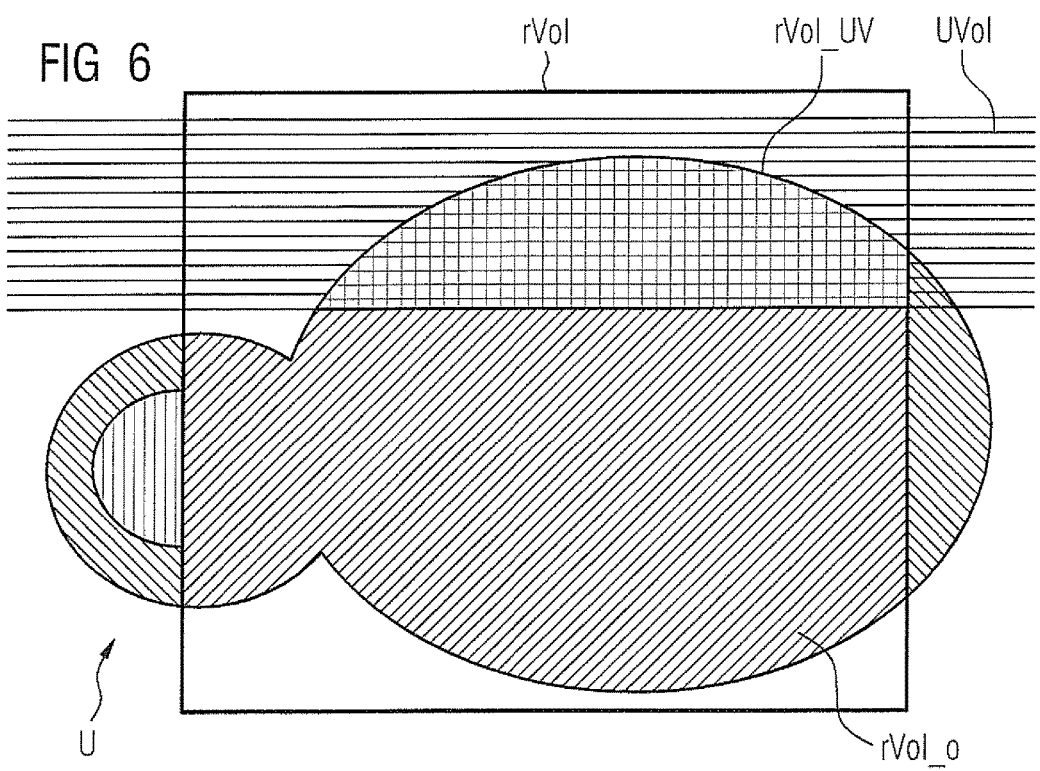

MAGNETIC RESONANCE APPARATUS AND METHOD FOR THE ACQUISITION OF SCAN DATA OF AN EXAMINATION OBJECT

BACKGROUND OF THE INVENTION

Field of the Invention

The invention relates to a method, a magnetic resonance system, and an electronically readable data medium for the acquisition of scan data of an examination object by magnetic resonance, wherein the scan data are recorded by execution of a scanning protocol including at least one suppression module.

Description of the Prior Art

Magnetic resonance (MR) technology is a known modality that can be used to generate images of the interior of an examination object. In simple terms, the examination object is positioned in a magnetic resonance scanner in a strong, static, homogeneous basic magnetic field, also called the $B_0$ field, with field strengths of 0.2 tesla to 7 tesla and more so that nuclear spins in the object align along the direction of the basic magnetic field. Radio frequency excitation pulses (RF pulses) are radiated into the examination object and trigger nuclear spin resonances, which produce signals that are measured as k-space data. MR images and spectroscopy data are determined on the basis of the k-space data. For spatial encoding of the scan data, rapidly switched magnetic gradient fields are superimposed on the basic magnetic field. The scan data recorded are digitized and stored as complex numerical values in a k-space matrix. An associated MR image is reconstructed from the k-space matrix populated with such values, for example by a multidimensional Fourier transform.

Methods based on magnetic resonance, both magnetic resonance imaging (MRI) and magnetic resonance spectroscopy (MRS) require "benign" ambient physical conditions in order to ensure the best possible quality of the data recorded. This relates, for example, to at least one of the following criteria: spatial homogeneity, temporal stability and absolute accuracy of the magnetic fields relevant for MR methods ($B_0$, the stationary basic magnetic field and $B_1$, the magnetic radio-frequency alternating field).

Known measures that can be used to at least partially compensate deviations from ideal ambient conditions include system-specific settings that attempt to correct the circumstances of the MR system used, such as eddy current-induced dynamic field disruptions or gradient sensitivities and examination object-specific settings, which attempt to compensate changes caused by the examination object introduced into the scanning volume of the MR system examination object, for example a patient, such as susceptibility-induced static field disruptions or spatial variations of the radio-frequency field.

With various MR scanning methods, certain signal components, for example from certain regions of the examination object or from certain tissue types, are deliberately suppressed during the acquisition of the scan data. This can be beneficial, for example, to improve a desired image contrast or to suppress interference, such as ghost artifacts or moving tissue parts.

In the context of a scanning protocol that defines, for example, the part of an examination object to be scanned, such as the anatomical structure to be scanned and the scanning sequence to be used, in short the "what" and the "how" of the scanning, the measures required for a suppression of this kind are defined in so-called suppression modules to be carried out in the context of the scanning protocol. Examples of such suppression modules include regional saturation pulses, which suppress signals from a spatially determined region of the examination object, chemically-selective saturation pulses, which suppress the signals from a specific chemical species (for example fat), inversion pulses, which suppress signals from tissue with a specific T1 relaxation time, flow preparation techniques, which suppress signals from tissue with specific flow velocities or also diffusion preparation techniques, which suppress signals from tissue with high diffusion coefficients.

Suppression modules of this kind can also be combined and several types of suppression module can be used in one scan, for example in the case of different spatially determined regions for which the signal components are to be suppressed.

SUMMARY OF THE INVENTION

An object of the invention is to develop methods for improving the quality of scan data obtained by the use of magnetic resonance techniques, by taking into account the ambient conditions for MR scanning methods that suppress specific signal components during acquisition, so as to make such methods faster and more efficient.

A method according to the invention for the acquisition of scan data of an examination object, by execution of a magnetic resonance scanning protocol having at least one suppression module, has the following steps.

A relevant volume in the examination object is determined in which the magnetization of the examination object to be examined is to be manipulated and/or from which the scan data are to be acquired.

For each suppression module included in the scanning protocol, the associated suppression volume in which signals are to be suppressed is determined.

The relevant volume is determined taking account of the suppression volumes. Optimized scanning parameters of the scanning protocol are determined such that the best possible scanning conditions prevail in the optimized relevant volume. The scanning protocol is executed by a scanner with the optimized scanning parameters that have been determined, and the scan data acquired thereby are made available as a data file.

The invention is based on the following consideration. It is generally the case that the ambient conditions only need to be optimized in places where relevant information is to be recorded. For example, it is sufficient for the optimization of the scanning parameters to be performed in places where there is also tissue to be examined (the spatial region outside the examination object can, as a rule, be ignored). The more precise the localization of the region in which the scanning parameters are to be optimized, the better the possibilities available for setting the scanning parameters for the homogenization of the ambient conditions. This basic consideration has been expanded by the invention to include the incorporation of regions from which no signal is to be scanned (suppression volume). Taking into account the suppression volumes determined during the determination of the optimized relevant volume in accordance with the invention and hence of the regions for which optimized scanning parameters are determined enables the quality of the acquired scan data to be significantly increased compared to methods that do not take account of such suppression volumes. It is possible to improve the spatial image fidelity and to achieve a higher and more homogeneous signal-to-noise ratio (SNR), more homogeneous image brightness and also more homogeneous image contrast.

A magnetic resonance system according to the invention having a magnetic resonance data acquisition scanner having a basic field magnet, a gradient coil arrangement, a radio-frequency antenna, and a control computer designed to carry out the method according to the invention.

The invention also encompasses an electronically readable data storage medium encoded with electronically readable program code that causes the method according to the invention to be implemented when the program code is executed by the control computer of a magnetic resonance system.

The advantages and embodiments described with respect to the method apply analogously to the magnetic resonance apparatus and the electronically readable data storage medium.

BRIEF DESCRIPTION OF THE DRAWINGS

FIGS. 5 and 6 show a second example of a relevant volume optimized dependent on a suppression volume in accordance with the invention.

DESCRIPTION OF THE PREFERRED EMBODIMENTS

Figure 1:
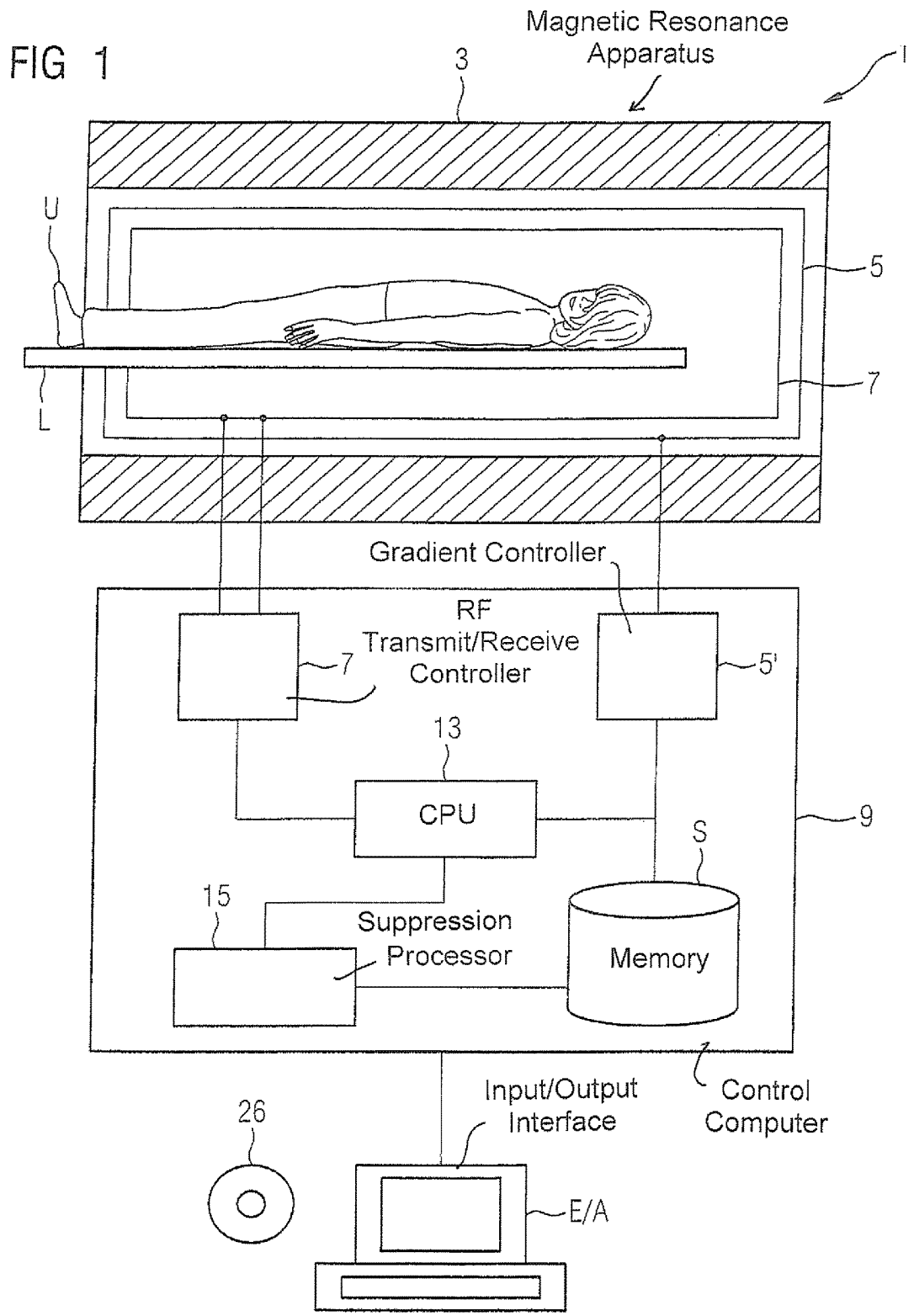
FIG. 1 schematically illustrates a magnetic resonance apparatus according to the invention.

FIG. 1 schematically shows a magnetic resonance apparatus 1 according to the invention. This has a data acquisition scanner with a basic field magnet 3 to generate the basic magnetic field, a gradient coil arrangement 5 to generate the gradient fields, a radio-frequency antenna 7 to radiate and receive radio-frequency signals, and a control computer 9 designed to carry out the method according to the invention. In FIG. 1, these units of the magnetic resonance apparatus 1 are shown only in a highly schematic depiction. For example, the radio-frequency antenna 7 can be formed by multiple sub-units, in particular multiple coils, which can be designed either to only transmit radio-frequency signals, or to only receive the radio-frequency signals triggered, or for both options.

For the examination of an examination object U, for example a patient or also a phantom, the scanning volume of the object can be introduced into the magnetic resonance apparatus 1 on a bed L.

The control computer 9 controls the magnetic resonance scanner and can control the gradient coil arrangement 5 by a gradient controller 5' and the radio-frequency antenna 7 by a radio-frequency transmit/receive controller 7'. The control computer 9 also has a suppression processor 15 designed to carry out the method according to the invention for the automatic assignment of at least one composite image of an examination object to a spin species depicted in the composite image (see FIG. 2). A control central processing unit (CPU) 13 of the control computer 9 is designed to carry out all the computing operations required for the necessary scans and determinations. Any interim results required for this or determined thereby can be stored in a memory S of the control computer 9. In this context, the units depicted should not necessarily be understood to be physically separate units in fact they only represent a subdivision into logical units which can be implemented, for example, in fewer physical units or even in only one single physical unit.

An input/output device E/A of the magnetic resonance apparatus 1 can be used by a user to enter control commands into the magnetic resonance system and/or to display results of the control computer 9, including, for example, image data.

The method described herein can be also be provided individually or separately in the form of a computer program that implements the respective method on a control device 9 when it is executed on the control computer 9. The program is formulated as program code stored in an electronically readable data medium 26 so as to be electronically readable and executed by control computer 9 of a magnetic resonance apparatus 1, so as to implement the method according to the invention.

Figure 2:
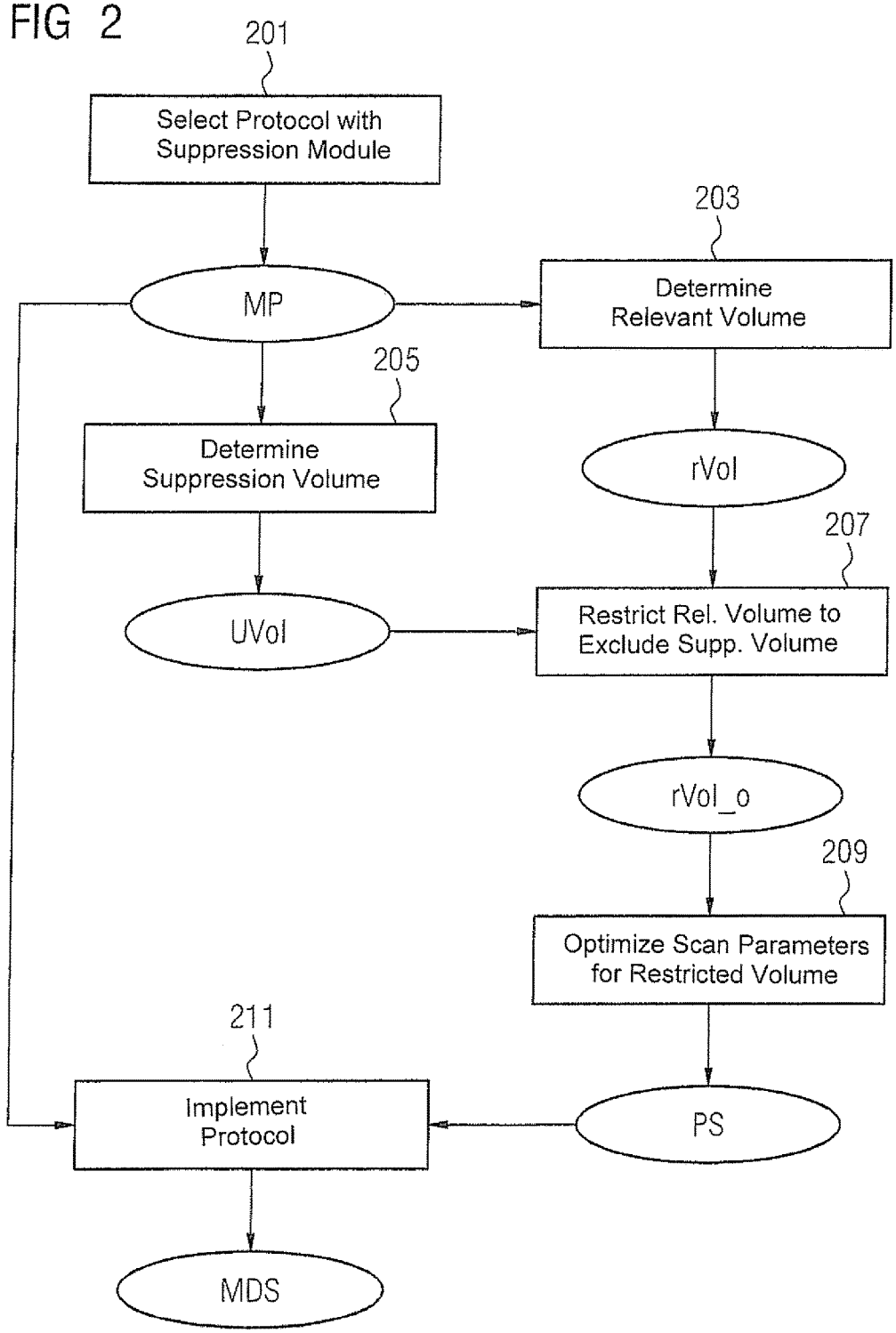
FIG. 2 is flowchart of the method according to the invention.

FIG. 2 is a flowchart illustrating the method according to the invention for the acquisition of scan data of an examination object by a magnetic resonance scanning protocol having at least one suppression module.

In Step 201, initially a desired scanning protocol MP comprising at least one suppression module is selected. Examples of such suppression modules are in particular modules with regional saturation pulses, modules with chemically selective saturation pulses, modules with inversion pulses, modules for flow preparation and modules for diffusion preparation. Such suppression modules can also be combined and several types of modules can be used in one scan.

In a further Step 203, a relevant volume rVol is determined in the examination object in which the magnetization of the examination object to be examined is to be manipulated and/or the scan data acquired taking account of the selected scanning protocol. Various methods are already known for a determination of this kind.

In one simple exemplary embodiment, in this case, the relevant volume rVol can be restricted by the maximum scanning volume of the magnetic resonance system used; this is defined by the design of the magnetic resonance system.

Additionally or alternatively, a first restriction of this kind to a relevant volume rVol can be performed taking account of the selected scanning protocol MP. For example, if the scanning protocol records data in one or more slice stacks (for example in the case of two-dimensional imaging) or in one or more predefined volumes (for example in the case of three-dimensional imaging), the relevant volume rVol can be automatically restricted to a geometry enveloping these spatial regions. If, for example the magnetization is to be manipulated in a partial volume of the examination object such that specific signal components are, for example, suppressed by saturation or marked in a specific way (for example within the context of a spin-labeling method), the relevant volume rVol can conform to the desired region in which the magnetization is to be correspondingly manipulated.

Additionally or alternatively, for example when planning a scan, the relevant volume rVol, can be restricted by user inputs to, for example, a volume of interest (VOI).

Additionally or alternatively, the relevant volume can, for example, be restricted by information on the extension of the examination object determined from a pre-scan. Pre-scans of this kind are often carried out in any case (for example for scanning field distributions) and can be used to determine the geometry of the examination object. If this means that the spatial location and extension of the examination object is known, the relevant volume rVol can (automatically) be restricted to the body geometry of the examination object. This can, for example, be performed by masking the background noise in the scan data obtained by means of the pre-scan.

Additionally or alternatively, the relevant volume rVol can be adapted at least one further time during the course of the scanning protocol. Here, it is in particular possible for there to be a varying restriction of the relevant volume to a currently "active" volume, for example a slice that is currently to be scanned.

Hence, the determination of the relevant volume can include a determination of the maximum scanning volume, a determination of volumes to be scanned as defined by the scanning protocol, a determination of a desired scanning volume, a determination of the scannable volume of the examination object and/or a determination of a currently relevant volume to be performed several times during the course of the scanning protocol.

In a further Step 205, the associated suppression volume UVol in which signals are to be suppressed is determined for each suppression module included in the scanning protocol MP.

In this case, the suppression modules that are to be actually activated for a scan can be derived, for example, from the scanning protocol MP used. Hence, this information is already fully available before the scan is started.

More precise information, for example on the spatial location of the suppression volumes, can be determined in various ways. For suppression modules with regional saturation pulses, the suppression volumes are, for example, directly defined by the scanning protocol MP. For suppression modules with chemically selective saturation pulses, the suppression volumes can, for example, be determined on the basis of previously recorded image data or on the basis of dedicated pre-scans. In this case, in particular images recorded with a Dixon technique enable the separation of regions with predominantly water and fat components. If, for example, the fat signal is suppressed in the scan to be optimized, corresponding suppression volumes can be extracted from a Dixon fat image obtained in this way. Alternatively to Dixon techniques, the use of segmentation algorithms is also conceivable, which—for example with the aid of a database or atlases—are able to assign different types of tissue. Segmentation methods also can be used in connection with the determination of the suppression volumes of other suppression modules, in particular in the case of suppression modules with inversion pulses, suppression modules for flow preparation and suppression modules for diffusion preparation.

It is also possible, for example, to carry out a quick pre-scan for the dedicated determination of the suppression volumes. In this case, a pre-identification scan of this kind can use the relevant suppression modules of the actual diagnostic scan, but can—for example by reducing the resolution of the scan or by adapting contrast parameters such as TE and TR—be carried out much more quickly than the actual scan in the sense of an adjustment scan.

In this case, the tissue assignment obtained by a pre-identification scan does not have to be complete or particularly perfect. It is sufficient to allow a corresponding assignment in at least partial regions of the examination object (for example, only the identification of the subcutaneous fat without the assignment of fat in the interior of the body). It is precisely in such a case that the method according to the invention can be used advantageously.

A suppression module of the scanning protocol can hence in particular be a regional saturation module, a chemically selective saturation module, an inversion module, a flow-preparation module and/or a diffusion-preparation module.

In a further Step 207, the relevant volume rVol determined in Step 203 is optimized taking account of the suppression volumes UVol determined and thus an optimized relevant volume rVol_o is obtained.

The volume for which the scanning parameters are to be optimized in order to create the most ideal conditions possible for the scan and hence improve the quality of the acquired scan data is hence further restricted using the relevant volumes rVol determined in Step 203 on the basis of the suppression volumes UVol. The resultant better localization of the regions for which the scanning parameters are to be optimized can achieve a greatly improved image quality.

Hence, the restriction of the volume in which the scanning parameters are to be optimized on the basis of the suppression volumes is performed additionally to other already known restrictions such as those described for example in Step 203 thus achieving a significant improvement in the quality of the scan data acquired using the optimized scanning parameters.

In a further Step 209, optimized scanning parameters PS of the scanning protocol are now determined such that the best possible scanning conditions prevail in the optimized relevant volume rVol_o.

This can take place statically for the entire scan or also dynamically in each case only for partial sequences of the scanning protocol. In the case of dynamic optimization of the scanning parameters PS, it is in particular also possible for the optimized relevant volume rVol_o to be determined at least one further time during the course of the acquisition of the scan data.

In this case, possible scanning parameters to be optimized include all adaptable setting parameters, in particular the NCO center frequency for the transmission and/or reception of the RF signals, gradient offsets, shim currents, RF amplitude scaling, RF transmit array settings, RF receive array setting, Maxwell compensation fields, gradient sensitivity settings, eddy current compensation settings etc.

In a further Step 211, the scanning protocol is implemented with the optimized scanning parameters determined and the scan data MDS acquired in this way is stored.

The stored scan data can in particular be used to obtain particularly high-quality image or spectroscopy data.

In an exemplary embodiment, the optimized scanning parameters PS determined for the optimized relevant volume rVol_o can be used throughout the entire scanning protocol MP.

It is also conceivable for the optimized scanning parameters PS determined for the optimized relevant volume rVol_o only to be used in modules of the scanning protocol MP, which are used for acquisition of scan data MDS. Since the scanning parameters PS were optimized precisely for the acquisition of the scan data MDS it is particularly advisable also to use them during the acquisition of said data. On the other hand, it can for example be advisable to determine individual, optimized suppression parameters for the suppression modules included in the scanning protocol MP such that the best possible conditions for the desired suppression prevail in the respective suppression volume UVol. This can take place in a similar way to the determination of the scanning parameters PS for the optimized relevant volume rVol_o but particularly with reference to relevant suppression volumes UVol in each case (see also FIG. 6). Alternatively, it is also possible not to optimize the scanning parameters for suppression modules further, or only to optimize them further with a known adjustment, and, instead of using their optimized scanning parameters according to the invention, only to use the recording of the scan data.

Figure 3:
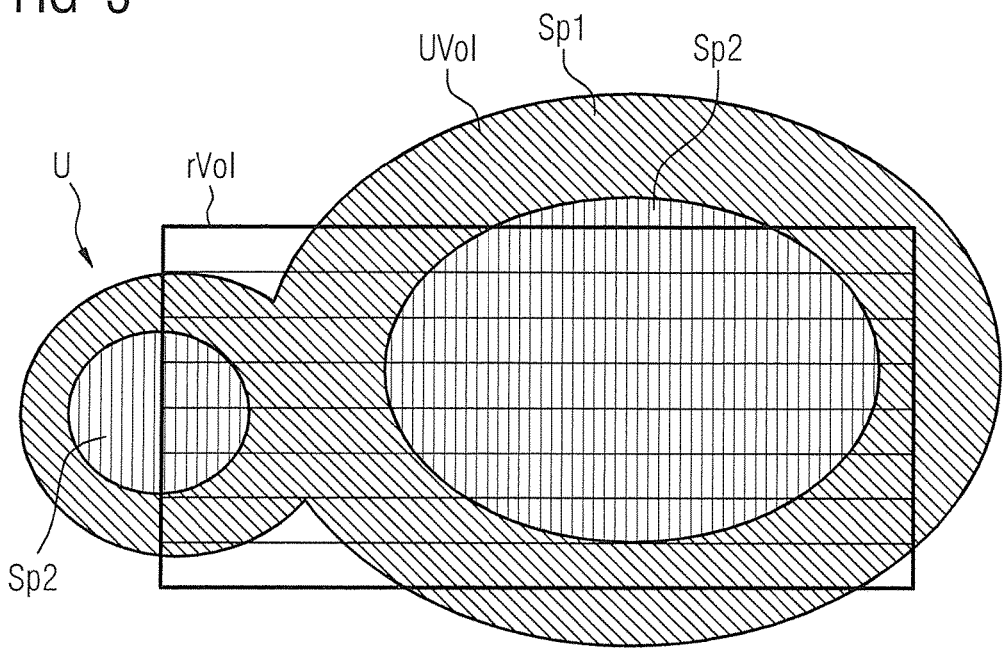
FIGS. 3 and 4 show a first example of a relevant volume optimized dependent on a suppression volume in accordance with the invention.
Figure 4:
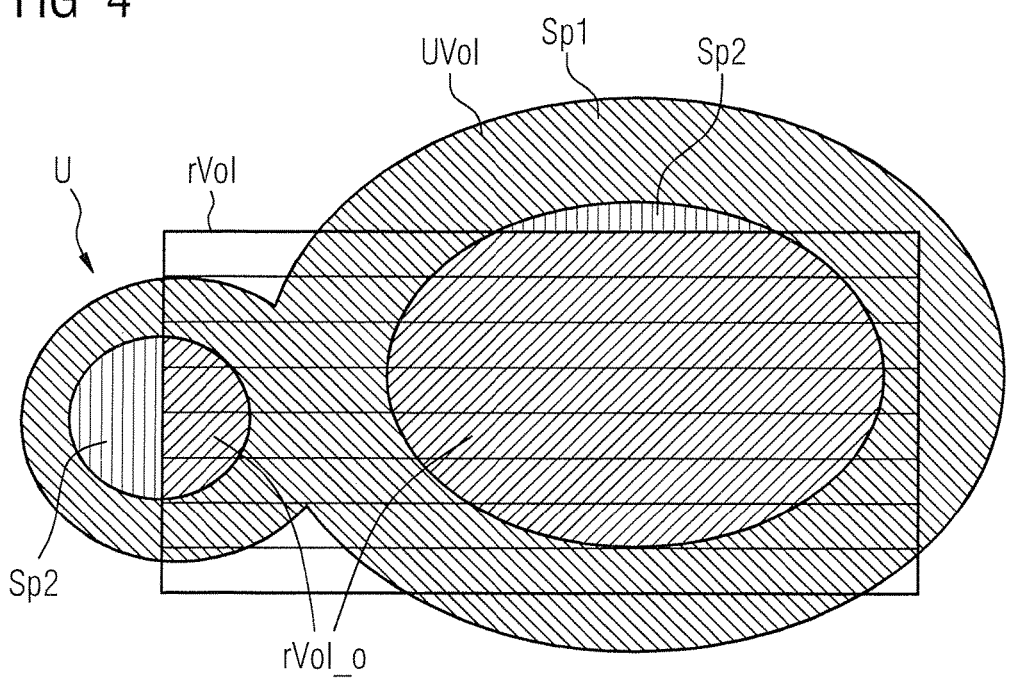

FIGS. 3 and 4 illustrate a first example of a relevant volume rVol_o optimized taking account of a suppression volume UVol.

FIG. 3 is a schematic depiction of a region of an examination object U located in a magnetic resonance system comprising regions Sp1, Sp2 in which different spin species Sp2 (depicted by hatched vertical lines) and Sp1 (depicted by hatched lines running from the top left to the bottom right) prevail. In this case, the spin species Sp1 and Sp2 could, for example, be "fat" and "water".

The rectangular region rVol represents the relevant volume for this scan. For example, this could be the region rVol, which is to be scanned by means of the slices indicated in rVol by transverse dividing lines using a multi-slice scan.

If the associated scanning protocol now for example provides a global suppression of the signals of the spin species Sp1, the suppression volume UVol is the same as the region occupied by the spin species Sp1. Such a global suppression of a spin species can be achieved, for example, a STIR module (STIR: "short-tau inversion recovery"), in particular for the spin species 'fat'.

FIG. 4 shows the optimized relevant volume rVol_o belonging to FIG. 3 depicted hatched from the top right to the bottom left. In order to arrive at the optimized relevant volume rVol_o depicted, it is, for example, possible on the one hand for the relevant volume rVol to be restricted to the region actually supplying signals of the examination object U and hence the white background regions in the previous relevant volume rVol are omitted. In each case, however the suppression volume UVol determined is taken into account in that that its intersection with the previous relevant volume rVol is subtracted from the previous relevant volume rVol in order to obtain the optimized relevant volume rVol_o. This means that taking into account the suppression volume causes the relevant volume rVol to be (further) restricted to the optimized relevant volume rVol_o. Hence, in this case, the optimized relevant volume is composed of two sub-regions depicted by the intersection of the previous relevant volume rVol with the volume of the non-suppressed spin species Sp1.

For the optimized relevant volume rVol_o determined in this way, it is now possible for optimized scanning parameters, in particular of the scan sequence used in the scanning protocol, to be determined such that the best possible scanning conditions for the acquisition of the scan data prevail in the optimized relevant volume rVol_o.

In the case of a global suppression of signals of a spin species, the optimized scanning parameters determined can be used both for the STIR suppression module, which is relatively insensitive to scanning parameters that have been set suboptimally and for the acquisition modules that particularly benefit from the optimization of the scanning parameters.

FIGS. 5 and 6 illustrate a second example of a relevant volume rVol_o optimized taking account of another suppression volume UVol.

In this case, FIG. 5 is again a schematic depiction of a region of an examination object U located in a magnetic resonance system.

The rectangular region rVol represents the relevant volume for this scan. For example, in a simple exemplary embodiment, this could be the region rVol defined by the scanning volume MV of the magnetic resonance apparatus 1.

If now the associated scanning protocol for example provides a regional suppression of the signals from a determined region, the suppression volume UVol (depicted by horizontal hatching) is the same as the region determined in this way.

FIG. 6 shows the optimized relevant volume rVol_o belonging to FIG. 5 which is again shown hatched from the top right to the bottom left.

To achieve the optimized relevant volume rVol_o depicted, it is, for example, possible on the one hand for the relevant volume rVol to be restricted to the region actually supplying signals of the examination object U and hence the white background regions in the previous relevant volume rVol are omitted. In each case, however, the suppression volume UVol determined is taken into account in that its intersection with the previous relevant volume rVol is subtracted from the previous relevant volume rVol in order to obtain the optimized relevant volume rVol_o. This means that taking into account the relevant volume rVol causes the suppression volume to be (further) restricted to the optimized relevant volume rVol_o.

For the optimized relevant volume rVol_o determined in this way, it is now possible for optimized scanning parameters, in particular of the scan sequence used in the scanning protocol, to be determined such that the best possible scanning conditions for the acquisition of the scan data prevail in the optimized relevant volume rVol_o.

In the examples shown in FIGS. 3 to 6, for clarity, in each case only one suppression module is active. If a plurality of suppression modules is active in a scan, all suppression volume of the active suppression modules can be taken into account during the determination of the relevant volume.

In another exemplary embodiment, further second optimized scanning parameters can be determined for the suppression module such that the best possible conditions for an optimum suppression prevail in the volume rVol_UV relevant for suppression (shown checkered). In this case, the relevant volume rVol_UV for the suppression can, for example, be formed by forming the intersection of the suppression volume UVol with the volume occupied by the examination object U.

If the scanning protocol implemented is used for the acquisition of a three-dimensional scan data record with which, for example, a plurality of slices (in the depiction shown lying one behind the other) are scanned one after the other during the course of the scanning protocol, the optimization of the relevant volume rVol to form an optimized relevant volume can be performed again dynamically during the course of the protocol, for example for each slice.

Although modifications and changes may be suggested by those skilled in the art, it is the intention of the inventor to embody within the patent warranted hereon all changes and modifications as reasonably and properly come within the scope of his contribution to the art.

The invention claimed is:

1. A method for acquiring magnetic resonance scan data from an examination object by operating a magnetic resonance data acquisition scanner according to a scanning protocol that comprises at least one suppression module, said method comprising:

in a computer, determining a relevant volume in the examination object, said relevant volume being selected from the group consisting of a volume in which magnetization of nuclear spins in the examination object is to be manipulated in the scanning protocol, and the volume in the examination object from which scan data are to be acquired;

for each suppression module in said scanning protocol, determining, in said computer, an associated suppression volume from which magnetic resonance signals are to be suppressed;

in said computer, automatically determining a restricted volume to which a parameter optimizing algorithm is to be applied, which includes said relevant volume and excludes each determined suppression volume;

in said computer, automatically determining optimized scanning parameters of the scanning protocol that cause best possible scanning conditions to prevail in the relevant volume by applying said parameter optimizing algorithm, only to said restricted volume, and thereby not applying said optimization algorithm to any of said suppression volumes; and operating the magnetic resonance data acquisition scanner with the scanning protocol with the determined optimized scanning parameters to obtain scan data from the relevant volume, and making the scan data available from the computer in electronic form as a data file.

2. A method as claimed in claim 1 comprising determining the optimized scanning parameters for the restricted volume as parameters that are used throughout an entirety of the scanning protocol.

3. A method as claimed in claim 1 comprising using said optimized scanning parameters for the restricted volume only in respective modules of the scanning protocol in which the scan data are acquired.

4. A method as claimed in claim 3 comprising also determining optimized suppression parameters for each suppression module that cause said best possible conditions to also prevail in each suppression volume, dependent on the type of suppression that occurs in the respective suppression volume.

5. A method as claimed in claim 1 comprising determining said relevant volume as a volume selected from the group consisting of a maximum scanning volume, a volume to be scanned that is defined by the scanning protocol, a selected scanning volume, a scannable volume of the object that is capable of being scanned, and a currently relevant volume that is determined multiple times during execution of said scanning protocol by said magnetic resonance data acquisition scanner.

6. A method as claimed in claim 1 comprising determining said restricted volume at least one additional time during acquisition of said scan data.

7. A method as claimed in claim 1 wherein said scanning protocol comprises, as said at least one suppression module, a suppression module selected from the group consisting of a regional saturation module, a chemically selected saturation module, an inversion module, a flow-preparation module, and a diffusion-preparation module.

8. A magnetic resonance apparatus comprising:

a magnetic resonance data acquisition scanner;

a control computer configured to operate the magnetic resonance data acquisition scanner to acquire scan data from an examination object by operating the scanner to execute a scanning protocol comprising at least one suppression module;

said control computer being configured to determine a relevant volume in the examination object, said relevant volume being selected from the group consisting of a volume in which magnetization of nuclear spins in the examination object is to be manipulated in the scanning protocol, and the volume in the examination object from which scan data are to be acquired;

said control computer being configured to determine for each suppression module in said scanning protocol, an associated suppression volume from which magnetic resonance signals are to be suppressed;

said control computer being configured to automatically determine a restricted volume to which a parameter optimizing algorithm is to be applied, which includes said relevant volume and excludes;

said control computer being configured to automatically determine optimized scanning parameters of the scanning protocol that cause best possible scanning conditions to prevail in the optimized relevant volume by applying said parameter optimizing algorithm, only to said restricted volume, and thereby not applying said optimization algorithm to any of said suppression volumes; and said control computer being configured to operate the magnetic resonance data acquisition scanner with the scanning protocol with the determined optimized scanning parameters to obtain scan data, and to make the scan data available from the control computer in electronic form as a data file.

9. A non-transitory, computer-readable data storage medium encoded with programming instructions, said storage medium being loaded into a control computer of a magnetic resonance apparatus that comprises a magnetic resonance data acquisition scanner, said programming instructions causing said control computer to:

operate the data acquisition scanner to acquire scan data from an examination object by executing a magnetic resonance scanning protocol comprising at least one suppression module;

determine a relevant volume in the examination object, said relevant volume being selected from the group consisting of a volume in which magnetization of nuclear spins in the examination object is to be manipulated in the scanning protocol, and the volume in the examination object from which scan data are to be acquired;

for each suppression module in said scanning protocol, determine an associated suppression volume from which magnetic resonance signals are to be suppressed;

automatically determine a restricted volume to which a parameter optimizing algorithm is to be applied, which includes said relevant volume and excludes;

automatically determine optimized scanning parameters of the scanning protocol that cause best possible scanning conditions to prevail in the optimized relevant volume by applying said parameter optimizing algorithm, only to said restricted volume, and thereby not applying said optimization algorithm to any of said suppression volumes; and operate the magnetic resonance data acquisition scanner with the scanning protocol with the determined optimized scanning parameters to obtain scan data, and make the scan data available from the computer in electronic form as a data file.

* * * * *